United States Patent
Schmidtke-Tran et al.

(10) Patent No.: US 10,147,846 B2
(45) Date of Patent: Dec. 4, 2018

(54) METHOD FOR PRODUCING CORE/SHELL NANOPARTICLES AND CORE/SHELL NANOPARTICLES

(71) Applicant: Fraunhofer-Gesellschaft Zur Förderung Der Angewandten Forschung E.V., München (DE)

(72) Inventors: Van Huong Schmidtke-Tran, Flensburg (DE); Steffen Jan Niehaus, Wentorf (DE); Horst Weller, Hamburg (DE); Daniel Ness, Hanau (DE)

(73) Assignee: Fraunhofer-Gesellschaft Zur Förderung Der Angewandten Forschung E.V., München (DE)

( * ) Notice: Subject to any disclaimer, the term of this patent is extended or adjusted under 35 U.S.C. 154(b) by 213 days.

(21) Appl. No.: 14/425,017

(22) PCT Filed: Aug. 29, 2013

(86) PCT No.: PCT/EP2013/067898
§ 371 (c)(1),
(2) Date: Feb. 28, 2015

(87) PCT Pub. No.: WO2014/033213
PCT Pub. Date: Mar. 6, 2014

(65) Prior Publication Data
US 2015/0214433 A1  Jul. 30, 2015

(30) Foreign Application Priority Data
Aug. 30, 2012  (DE) .................. 10 2012 215 421

(51) Int. Cl.
*H01L 33/28*  (2010.01)
*B01J 13/02*  (2006.01)
(Continued)

(52) U.S. Cl.
CPC .............. *H01L 33/28* (2013.01); *B01J 13/02* (2013.01); *B01J 19/2475* (2013.01);
(Continued)

(58) Field of Classification Search
None
See application file for complete search history.

(56) References Cited

U.S. PATENT DOCUMENTS

| 6,207,229 B1 | 3/2001 | Bawendi et al. |
| 7,144,458 B2 | 12/2006 | Zehnder et al. |

(Continued)

FOREIGN PATENT DOCUMENTS

| DE | 25 12 099 A1 | 9/1975 |
| DE | 101 31 173 A1 | 1/2003 |

(Continued)

OTHER PUBLICATIONS

Yang et al., "Highly Luminescent CdSe/CdxZn1-xS Quantum Dots with Narrow Spectrum and Widely Tunable Wavelength", Journal of Physical Chemistry C, vol. 115, No. 30, Aug. 4, 2011, pp. 14455-14460, XP055103201.

(Continued)

*Primary Examiner* — Erma C Cameron
(74) *Attorney, Agent, or Firm* — Mintz Levin Cohn Ferris Glovsky and Popeo, P.C.; Peter F. Corless

(57) ABSTRACT

The present invention relates to a process for the continuous preparation of core-shell nanoparticles, comprising a core of a core material, preferably of a semiconductor material, and a shell of a shell material, preferably of a semiconductor material, wherein selected starting materials for the shell material are mixed with a dispersion of nanoparticles of the core material and are passed continuously through a reaction zone of a tubular reactor, and other starting materials for the shell material are fed to the reaction zone of the tubular (Continued)

reactor at two or more locations, preferably via a tubular membrane, and the starting materials for the shell material react in the reaction zone to form a shell around the nanoparticles of the core material. The invention also relates to the tubular reactor with the membrane and its use for the continuous synthesis of core-shell nanoparticles.

The invention also relates to core-shell nanoparticles comprising a core of a core material, preferably of a first semiconductor material, and an outer shell of a shell material, characterized in that, between core and shell, there is only a layer of a transition zone, in which the proportion of the core material gradually decreases toward the shell, while the proportion of the shell material gradually increases.

9 Claims, 4 Drawing Sheets

(51) Int. Cl.
| | | |
|---|---|---|
| *C09K 11/88* | (2006.01) | |
| *C23C 10/24* | (2006.01) | |
| *H01L 33/00* | (2010.01) | |
| *H01L 33/06* | (2010.01) | |
| *B01J 19/24* | (2006.01) | |
| *B82Y 40/00* | (2011.01) | |
| *B82Y 20/00* | (2011.01) | |

(52) U.S. Cl.
CPC ............ *C09K 11/883* (2013.01); *C23C 10/24* (2013.01); *H01L 33/0083* (2013.01); *H01L 33/06* (2013.01); *B01J 2219/00099* (2013.01); *B82Y 20/00* (2013.01); *B82Y 40/00* (2013.01); *Y10S 977/774* (2013.01); *Y10S 977/892* (2013.01); *Y10S 977/95* (2013.01)

(56) References Cited

U.S. PATENT DOCUMENTS

| | | |
|---|---|---|
| 2003/0017264 A1 | 1/2003 | Treadway et al. |
| 2003/0103879 A1 | 6/2003 | Jahn et al. |
| 2005/0129580 A1 | 6/2005 | Swinehart et al. |
| 2006/0028882 A1 | 2/2006 | Qu |
| 2006/0255323 A1 | 11/2006 | Seki et al. |
| 2007/0128350 A1 | 6/2007 | Nakamura et al. |
| 2009/0236563 A1 | 9/2009 | Goan et al. |
| 2010/0140586 A1 | 6/2010 | Char et al. |
| 2011/0042611 A1* | 2/2011 | Weller ............... B01J 19/24 252/182.33 |

FOREIGN PATENT DOCUMENTS

| | | |
|---|---|---|
| DE | 601 24 106 T2 | 6/2007 |
| EP | 1 284 159 A2 | 2/2003 |
| GB | 1 497 716 A | 1/1978 |
| JP | 2005-177746 A | 7/2005 |
| JP | 2005-519782 A | 7/2005 |
| JP | 2012-087220 A | 5/2012 |
| WO | 02/08311 A2 | 1/2002 |
| WO | 03/092043 A2 | 11/2003 |
| WO | 2007/086267 A1 | 8/2007 |
| WO | 2009/101091 A1 | 8/2009 |

OTHER PUBLICATIONS

Talapin et al., "Highly Luminescent Monodisperse CdSe and CdSe/ZnS Nanocrystals Synthesized in a Hexadecylamine-Trioctylphosphine Mixture", Nano Letters, American Chemical Society, vol. 1, No. 4, Mar. 16, 2001, pp. 207-211, Xp002235569.

Peng et al., "Epitaxial Growth of Highly Luminescent CdSe/CdS Core/Shell Nanocrystals with Photostability and Electronic Accessibility", J. Am. Chem. Soc. 1997, 119, 7019-7029.

Farmer et al., "Photoluminescent Polymer/Quantum Dot Composite Nanoparticles", Chem. Mater: 2001, 13, 3920-3926.

Zhu et al., "Low temperature synthesis of ZnS and CdZnS shells on CdSe quantum dots", Nanotechnology 21, (2010) 255604; 1-10.

Xie et al., "Synthesis and Characterization of Highly Luminescent CdSe-Core CdS/Zn0.5S/ZnS Multishell Nanocrystals", J. Am. Chem. Soc. 2005, 127, 7480-7488.

Li et al., "Large-Scale Synthesis of Nearly Monodisperse CdSe/CdS Core/Shell Nanocrystals Using Air-Stable Reagents via Successive Ion Layer Adsorption and Reaction", J. Am. Chem. Soc., 2003, 125, 12567-12575.

Wang et al., "Solution-Liquid-Solid Synthesis of Semiconductor Nanowires Using Clusters as Single-Source Precursors", Small 2011, 7, No. 17, 2464-2468.

\* cited by examiner

METHOD FOR PRODUCING CORE/SHELL NANOPARTICLES AND CORE/SHELL NANOPARTICLES

CROSS-REFERENCE TO RELATED APPLICATIONS

This application is a 35 U.S.C. § 371 U.S. national entry of International Application PCT/EP2013/067898 (WO 2014/033213) having an International filing date of Aug. 29, 2013, which claims under 35 U.S.C. § 119 the benefit of German Application No. 10 2012 215 421.3, filed Aug. 30, 2012. The entire contents of both applications are incorporated herein by reference in their entirety.

The present invention relates to a novel process for the preparation of core-shell nanoparticles and the core-shell nanoparticles obtainable by this process. The invention also relates to a tubular reactor for continuously preparing these core-shell nanoparticles.

TECHNICAL BACKGROUND

In recent years, the study of nanoparticles has received much interest due to the unique properties of nanoparticles. The physical properties of nanoparticles are fundamentally different from those of the corresponding bulk material. These different physical properties of the nanoparticles are due to the reduced size of the nanoparticles, which is between that of a macroscopic substance and the molecular size. The difference in physical properties between the base material (bulk material) and a nanoparticulate material is due to the increase in the surface/volume ratio and the size of the nanoparticles, which moves toward a magnitude where quantum effects can become dominant. The surface/volume ratio, which increases when the nanoparticles become smaller, leads to an increasing influence of the atoms on the surface of the nanoparticle with respect to the atoms that are located in the interior of the nanoparticle.

The quantum effect phenomenon affects not only the properties of the nanoparticle considered in isolation, but also the properties of the nanoparticle in its interaction with other materials. Therefore, nanoparticles have experienced great interest in areas of research in which a large surface area is required, for example in the field of catalysis, or when used in electrodes, semiconductors, optical devices and fuel cells.

Currently, several methods for the production of nanoparticles exist. These include gas phase deposition, wet chemical synthesis and grinding of the corresponding bulk material.

WO 2009/101091 relates to an apparatus for the production of nanoparticles comprising: at least one module for solution preparation, at least one module for particle synthesis, comprising three chambers heated independently from each other, wherein the at least one module for solution preparation is connected in series with the at least one module for particle synthesis.

This international application also discloses a method for producing nanoparticles, which comprises the following steps: the production of at least two solutions of particle precursors, the separate and substantially simultaneous preheating of the at least two solutions of particle precursors at a first temperature, said first temperature being at least the nucleation temperature of the particles, the mixing of the at least two solutions of particle precursors at a second temperature wherein the second temperature is substantially the same as the first temperature, with the formation of the nanoparticles, the growth of particles at a third temperature, said third temperature being lower than the first temperature.

Example 4 of this application relates to the production of CdSe—CdS core-shell nanoparticles according to this method.

The passivation of CdSe cores or other semiconductor nanoparticles by an inorganic shell material is a known method to increase the stability of the particles and their luminous efficiency, which is measurable in terms of the quantum yield. For example, it is known to coat CdSe nanoparticles with either CdS or ZnS shell material, since the band gap of CdSe is smaller than that of CdS or ZnS, and thus it can be ensured that photo-generated electrons and holes are primarily confined to the core material CdSe. A disadvantage in producing such nanoparticles, which are constructed only of core and shell materials, however, is the lattice strain, arising from the fact that the lattice constants of core and shell materials do not match. This difference in lattice constants is for example 3.9% for CdSe compared with CdS and 12% for CdSe compared with ZnS. This lattice strain may adversely affect the quantum yield and further result in the formation of particles with irregular shape.

Core-shell nanoparticles are mentioned or described in detail for example in the following documents: U.S. Pat. No. 7,144,458 B2 (flow synthesis of quantum dot nanocrystals), US 2003/0017264 A1 (luminescent nanoparticles and methods for their preparation), U.S. Pat. No. 6,207,229 B1 (highly luminescent color-selective materials and methods of making thereof); Peng X., et al. "Epitaxial growth of highly luminescent CdSe/CdS core-shell nanocrystals with photostability and electronic accessibility", J. Am. Chem. Soc. 1997, 119, 7019-7029; Farmer, S. C. and Patten, T. E., Photoluminescent polymer/quantum dot composite nanoparticles. Chem. Mater. 2001, 13, 3920-3926 concerning core-shell $CdS/SiO_2$ nanoparticles; US 2006/0028882 A1 (Alloyed semiconductor nanocrystals); DE 10131173 A1 (process for producing a core-shell particle, wherein the core is a nanoscale particle); Ping Yang et al. (Highly luminescent $CdSe/Cd_xZn_{1-x}S$ quantum dots with narrow spectrum and widely tunable wavelength), J. Phys. Chem. C 2011, 115, 14455-14460. Huiguang Zhu et al., Low temperature synthesis of ZnS and CdZnS shells on CdSe quantum dots, Nanotechnology 21 (2010) 255604 teaches that the quantum yield of CdSe core nanocrystals increases from 10 to 36% and from 10 to 40%, respectively, in CdSe/ZnS and CdSe/CdZnS core-shell nanocrystals.

Renguo Xie et al. describe in J. Am. Chem. Soc. 2005, 127, 7480-7488, the synthesis and characterization of highly luminescent multi-layered core-shell nanocrystals having a CdSe core and a $CdS/Zn_{0.5}Cd_{0.5}S/ZnS$ shell. The authors use the so-called SILAR method according to J. J. Li et al. (J. Am. Chem. Soc., 2003, 125, 12567-12575). In a non-continuous process, 3 ml of ODE (octadecene-1) and 1 g of ODA (octadecylamine) were added to a 50-ml reaction vessel and then mixed with the CdSe core particles in hexane and heated to 100° C. The starting materials for the shell material are then added to grow up to 2 monolayers of CdS, 3.5 monolayers of $Zn_{0.5}Cd_{0.5}S$ and two monolayers of ZnS.

The authors argue that because of this gradual change in the composition, the resulting nanoparticles have a high crystallinity. Purportedly, quantum yields of 70-85% for amine-stabilized multi-shell particles in organic solvents and a quantum yield of up to 50% for mercaptopropionic acid-stabilized particles in water could be obtained.

WO 2003/092043 describes luminescent core-shell particles which may have a transition zone which contains an additive which is selected among Cd, Se, Te, S, In, P, As, Pb, O, Si, and Al. Example 1 describes e.g. a preparation method of CdSe/ZnS core-shell particles, in which is added, to the CdSe cores, the additive Cd (as dimethylcadmium) before growing the ZnS shell. WO 2003/092043, however, does not teach how to make a transition zone, which consists only of core and shell material and having opposite gradients for core and shell materials.

If the synthesis of core-shell nanoparticles is carried out according to a batch process, e.g. according to the procedure of Xie et al. or according to WO 2003/092043, one usually notes batch-to-batch variations in product properties, that one wishes to minimize in order to guarantee the buyer of nanoparticles as uniform a product quality as possible.

Both, the method described by Renguo Xie et al. and the method of WO 2003/092043 are not suitable for producing relatively large amounts of core-shell nanoparticles and cannot be carried out continuously. The method according to Xie et al. is also very complicated, since it requires the exact calculation and dosage of the starting materials for the shells.

It would be desirable to provide novel and simply structured core-shell nanoparticles, in which the lattice strain between the desired core material and the desired outer shell material can be reduced in other ways.

A disadvantage of many nanoparticles (NP) syntheses is also the fact that, apart from the growth of the NP, the formation of new NP-nuclei ("nucleation") occurs. The result are NP dispersions with a very broad size distribution. Especially in the synthesis of core-shell NP, it is particularly important to suppress this unwanted nucleation. Otherwise, there are formed, from the starting materials for the shell material, in addition to the shell, new NP around the core, which can often no longer be separated from the product mixture.

In view of the above-described prior art, it would be desirable to obtain core-shell nanoparticles having a very narrow or narrower particle size distribution.

It is an object of the present invention to provide a novel process for the preparation of core-shell-NP, which suppresses the unwanted nucleation during shell growth.

It is a further object of the present invention to provide a novel process for the preparation of core-shell NP, which leads to a very narrow particle size distribution.

It is a further object of the present invention to provide a novel process for the preparation of core-shell nanoparticles that results, even when the process is carried out repeatedly, in NP having very homogeneous product properties.

It is a further object of the present invention to provide, preferably in a narrow particle size distribution, new core-shell NP, in which the lattice strain between the desired core material and the desired shell material is minimized.

It is a further object of the present invention, to provide core-shell NP having excellent luminescence properties, for example, a very good quantum yield.

Finally, it is an object of the invention to provide a tubular reactor and its use for the continuous production of core-shell nanoparticles, which allows for a technologically and economically optimal implementation of the above process while achieving the advantages of the present invention.

SUMMARY OF THE INVENTION

The invention relates to a process for the continuous preparation of core-shell nanoparticles, comprising a core of a core material, preferably of a first semiconductor material, and a shell of a shell material, preferably of a second semiconductor material, the process comprising the steps of:

a) preparing a dispersion of nanoparticles of the core material (such as CdSe) in a solvent, b) providing all starting materials for the shell material (e.g. CdZnS), preferably in dissolved form, c) the selection of one or more starting materials for the shell material for the mixing in step d), the selection being made so that the selected starting materials do not react with each other (if more than one starting material is selected), for example, by selecting all the starting materials for the metal components of the shell material, or by the selection of all starting materials for the non-metal components of the shell material, d) mixing the selected starting material or the selected starting materials for the shell material (e.g. Cd solution and Zn solution) with the dispersion of the nanoparticles of the core material (e.g. CdSe)

e) continuously passing the mixture obtained in step d) through a reaction zone of a tubular reactor, f) continuously feeding the starting material or the starting materials for the shell material not selected in step c (for example, S-solution) to the reaction zone at two or more locations, g) reacting the starting materials for the shell material in the reaction zone forming a shell around the nanoparticles of the core material.

Preferably both the core material and the shell material are constituted by metals and nonmetals, and the process comprises the steps of:

a) preparing a dispersion of nanoparticles of the core material, preferably a semiconductor such as ZnS or CdSe, in a solvent, b) providing all starting materials for the shell material, preferably a second semiconductor such as ZnS or CdZnS, preferably in dissolved form, c) selecting one or more starting materials for the metal component(s) of the shell material or the selection of one or more precursors for the non-metal component(s) of the shell material for the mixing in step d), d) mixing the selected starting material or the selected starting materials for the shell material (e.g. Cd solution and Zn solution) with the dispersion of the nanoparticles of the core material (e.g. CdSe)

e) continuously passing the mixture obtained in step d) through a reaction zone of a tubular reactor, f) continuously feeding the starting material not selected in step c) or the starting materials for the shell material not selected in step c) (e.g. S-solution) to the reaction zone at two or more locations, g) reacting the starting materials for the shell material in the reaction zone to form a shell around the nanoparticles of the core material.

Thus, in step f), one continuously feeds one or more starting materials for the metal component(s) of the shell material or one or more starting materials for the non-metal component(s), depending on whether, in step d), the starting materials for the non-metal component(s) or the metal component(s) were added to the dispersion of the nanoparticles of the core material.

According to a preferred embodiment, the core-shell nanoparticles have, between core and shell, a transition zone, which consists only of the components of the core and the components of the shell material, and in which the proportion of the core material is gradually reduced in the direction of the shell, while the proportion of the shell material gradually increases. To form this transition zone, the dispersion of particles of the core material produced in step a) contains at least one starting material for the core material. The presence of a starting material for the core material is then sufficient to form a transition zone, if the other starting material(s) for the core material are provided by the starting material for the shell material, for example because the core and shell comprise the same metal components (e.g. Cd). Otherwise, in this embodiment of the process, one will take care that the dispersion of particles of the core material produced in step a) includes all the starting materials for the core material.

Another aspect of the invention relates to core-shell nanoparticles comprising a core of a first semiconductor material, and an outer shell made of a shell material, preferably of a second semiconductor material, characterized in that, between the core and shell, there is only a layer of a transition zone, consisting only of the components of the core and the components of the shell material, and in which the proportion of the core material is gradually reduced in the direction of the shell, while the proportion of the shell material increases gradually.

According to a further aspect of the invention, a tubular reactor for the continuous production of core-shell nanoparticles is provided having (i) a tubular cavity surrounded by a wall and (ii) a membrane arranged lengthwise (along the flow direction) in the cavity, which divides the cavity into an addition zone (9) and a reaction zone (10) (see FIG. 3), wherein the reactor has, at one end, a feed line for mixtures of starting material for the shell and the core particle dispersion leading into the reaction zone, and, at the other end, a discharge line for formed core-shell nanoparticles leading out from the reaction zone (10). The tubular reactor of the invention is characterized in that at least one connection (5) is provided along the cavity in the wall for adding additional starting material for the shell, which connection opens into the addition zone (9).

The membrane, which is arranged longitudinally in the cavity, that is, along the tubular extension, and the thus created, addition and reaction zones (9, 10), which are separated by the membrane and also oriented along the cavity, allow a gradual reaction, taking place along the entire cavity, of the added further shell starting materials with the mixture of further starting material for the shell and core particle dispersion. Since the mixture is introduced into the reaction zone from one end of the tubular reactor and the added starting material located in the addition zone flows through the membrane along the entire length of the cavity, this allows an increase, in the flow direction of the mixture, of the concentration of shell material in at least a portion of the reaction zone, preferably at a constant concentration of cores (without shell or with growing shell). Preferably, in the reaction zone, there is available only a relatively low concentration of starting materials for the shell material, which reacts preferentially by shell formation. The formation of new nuclei of shell material ("nucleation") is suppressed in this way and the fed shell starting material in the direction of flow of the mixture serves only the further build-up of the shell.

When the dispersion of particles of the core material produced in step a) contains starting materials for the core material, there occurs, in a preferred embodiment, in the nanoparticles, the formation of a gradual transition from the core to the shell, whereby the lattice strain between the desired core material and the desired shell material is minimizes.

DETAILED DESCRIPTION OF THE INVENTION

Figure 1:
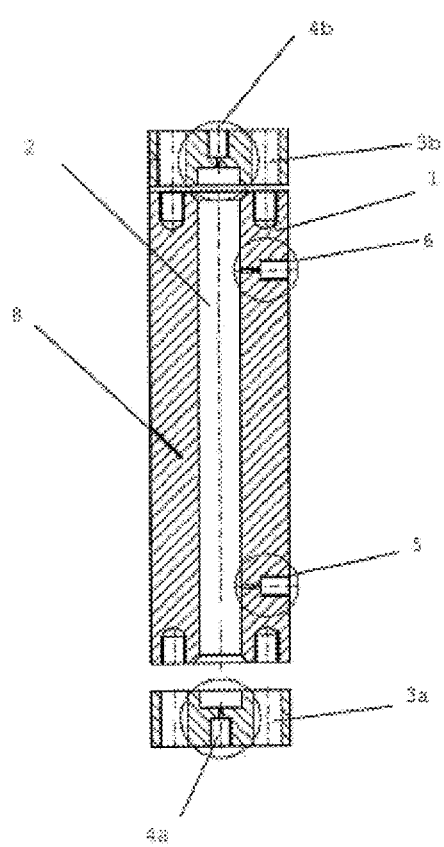
FIG. 1 shows a longitudinal cross section through a tubular reactor (without a membrane) with which the inventive process can be carried out advantageously.

The present invention relates to a process for the continuous preparation of core-shell nanoparticles, comprising a core of a core material, preferably a first semiconductor material, and a shell of a shell material, preferably a second semiconductor material.

The term nanoparticle refers to a maximum average dimension (diameter) of the particles in the nanometer range, that is below 1 µm. Preferably, however, the average diameter is 100 nm or less, particularly less than 50 nm.

The terms "shell" and "shell material" refer to the outermost layer of the particle. The core and shell are typically present in crystalline form. Between the core and shell, in a particularly preferred embodiment of the invention, there may be present a transition layer with opposing concentration gradients of the core and shell material, as will be explained later. The core-shell nanoparticles may also be surrounded by a shell of organic stabilizer molecules, which prevents the agglomeration of individual nanoparticles. This stabilizer is also explained in detail later.

The core and shell of the nanoparticles are preferably composed of a first and a second semiconductor material. Preferably, the semiconductor materials are selected from II-VI, III-V, or IV-VI compounds. For compatibility reasons, one often selects the first and second semiconductor material so that both belong to the same class of compounds, i.e. II-VI, III-V, or IV-VI. However, it is also possible to use a III-V core to surround a II-VI (for example, ZnS) or IV-VI shell.

In addition, the selection is preferably carried out for all combinations of core and shell material so that the core and shell material have the same lattice structure and the lattice constants are preferably as similar as possible. This means for the mutually corresponding lattice constants of the core and of the shell materials, that the larger lattice constant differs from the smaller lattice constant preferably by not more than 30%, more preferably not more than 15%, even more preferably not more than 10%.

An additional selection criterion that is preferably also taken into account is that one selects the core and shell material among semiconductor materials (preferably, II-VI, III-V, or IV-VI) so, that the band gap of the core material is smaller than the band gap of the shell material.

Examples of suitable III-V compounds are AlP, AlAs, AlSb, AlN, GaP, GaAs, GaSb, InP, InAs, InSb, InN, AlGaN, AlGaP, AlGaS, GaInAs, GaInN, GaInP and other III-V compounds containing two or more of the elements Al, Ga and In with N, P, As or Sb.

Among the III-V semiconductor materials, one preferably selects the core and the shell material in such a way that the band gap of the core material is smaller than the band gap of the shell material, so that the photo-generated electrons and holes are mainly confined to the core.

The III-V core material may also be doped with 0.1 to 10 mol %, based on the total content of metals, with transition metals or rare earth metals, such as Mn, Co, and Eu. This also applies to the III-V-shell material.

The II-VI compounds can be selected, for example, among CdS, CdSe, CdTe, ZnS, ZnSe, ZnTe, MgTe, HgS, HgSe, HgTe, and CdZnS. Also preferred is a selection of II-VI compounds in which two or more of the elements Zn, Cd and Hg, preferably Zn and Cd, are combined with S or Se.

The II-VI or IV-IV core material may further be doped with 0.1 to 10 mol %, based on the total content of the metal atoms, of transition metals or rare earth metals, e.g. Mn, Co, or Eu.

The IV-VI compounds can be selected, for example, among PbS, PbSe, or PbTe.

Preferred combinations of core-shell materials include CdSe/ZnS or CdSe/CdZnS.

Non-semiconductors, such as $SiO_2$, can also be used as the shell material.

The inventive process comprises at least the above steps a) to g) which are explained in the following. One should understand that, unless this necessarily follows from the definition of these steps, the letters define no chronological order. For example, the selection step c) can also be performed prior to providing the starting materials for the shell material. Similarly, due to the continuous procedure, the steps d), e), f) and g) usually take place simultaneously.

In step a), one provides a dispersion of nanoparticles of the core material in a solvent.

Since the reaction is preferably carried out at atmospheric pressure (disregarding the pressure generated by the metering of the starting materials, for example, via a pump, in step f), one chooses the solvent in such a way that its boiling point significantly exceeds the desired maximum reaction temperature, preferably by at least 10K, especially at least 30K, at least 50K or even at least 100K. The maximum reaction temperature is usually 90 to 290° C., preferably 240 to 260° C.

Preferably, therefore, one selects solvents having a boiling point of at least 90° C., e.g. at least 100° C., at least 150° C., or at least 200° C., which can be selected, for example, among hydrocarbons, carboxy acids, phosphor-organic compounds and organic compounds containing nitrogen. The hydrocarbons may be aromatic or aliphatic. Preferably one selects unsaturated aliphatic hydrocarbons having a boiling point of at least 200° C., preferably at least 250° C., such as octadecene or squalene. The carboxy-acids are preferably aliphatic carboxy acids having a boiling point of at least 200° C., preferably alkanoic or alkenoic acids having 12 to 20 carbon atoms, such as oleic acid.

The organophosphorus compounds are preferably phosphines or phosphine oxides with three aliphatic and/or aromatic radicals which have a boiling point of at least 200° C., for example, trioctylphosphine, trioctylphosphine oxide or triphenylphosphine. The organic nitrogen compound can be aromatic or aliphatic and is preferably a primary alkyl amine having a boiling point of at least 200° C., for example, a C12 to C20 alkyl amine such as hexadecylamine or oleylamine.

Carboxy acids, organic phosphorus and nitrogen-containing organic solvents can, as will be explained later, in addition perform the function of a stabilizer. Individual organophosphorus compounds such as trioctylphosphine or triphenylphosphine can also serve as a source of phosphorus.

The dispersion of the core nanoparticles is preferably prepared in accordance with the teaching of WO 2009/101091 of CAN GmbH. This describes in the examples, only the preparation of II-VI compounds. The preparation of IV-VI compounds can be carried out analogously or in other ways described in the prior art. The production of III-V-core particles can be carried out according to a further application of CAN GmbH, WO 2009/065639.

In the synthesis of II-VI or IV-VI compounds, one provides the starting material for the VI component (preferably a chalcogen such as S or Se) preferably in a dissolved form, for example by dissolving selenium or sulfur in a suitable solvent such as trioctylphosphine. In a further embodiment, the starting material for the VI component is a silyl compound of the VI-element, such as bis(trimethylsilyl)sulfide, which is dissolved in a suitable solvent such as trioctylphosphine. Thiourea, which releases $H_2S$ at elevated temperature, can also be used. The starting material for the II or the IV component is preferably a salt, especially an organic salt of the II-element, for example, an acetate such as zinc or cadmium, or an organic salt of the IV-element such as lead acetate.

For preparing a stable dispersion of the core nanoparticles, one usually adds to the reaction mixture a stabilizer which is also referred to in the literature as "end capping agent". The function of this stabilizer is to prevent, by attaching to the particle surface, an aggregation of individual particles and to stabilize the nanoparticulate state. Suitable stabilizers have a polar functional group, preferably containing one or more elements selected from P, N, S and O, for example a phosphine, amine, thio or carboxyl group, which is bonded to one or more organic radicals. The number of carbon atoms per organic residue is preferably at least three, preferably at least five carbon atoms. The number of carbon atoms per organic residue is usually not more than 30, especially not more than 20.

Certain solvents such as carboxy acids, phosphines, amines or polyols may also serve as a stabilizer. Mixtures of two or more stabilizers may be used.

In step b) of the process according to the invention, the starting materials for the shell material are provided, preferably in dissolved form. Preferably, all starting materials for the shell material are provided in dissolved form. Preferably, the providing is performed such that each individual starting material, i.e. preferably, each metal component of which the shell material is made up, and each non-metal component of which the shell material is made up, is provided separately, preferably in dissolved form. At least one solution of a starting material, preferably all the solutions, contain a stabilizer capable of binding to the surface of the formed core-shell particles with a functional group (as previously described). It should be noted here that, as explained above, various stabilizers, such as carboxy acids, such as oleic acid, organophosphorus compounds, such as phosphines, organic nitrogen compounds such as amines, or polyols, for example, alkyl diols, glycerol, or (poly) ethylene glycol, may simultaneously serve as solvent. As previously described in connection with the core synthesis, one uses in the production of II-VI or IV-VI shell materials for example thiourea, preferably silyl compounds or the elemental form of the VI-component, preferably a chalcogen such as S or Se. However, sulfur or selenium can also be provided in gaseous form ($H_2S$ or $H_2Se$) and supplied in step f). Also with regard to the selection of starting materials for the II or IV components, solvents and/or stabilizers, the above explanations fully apply.

An essential element of the process is that not all starting materials for the shell material are mixed and fed simultaneously with the dispersion of the core particles. In step c) of the process, therefore one makes a selection of which starting materials are to be mixed (in step d)) with the dispersion of the core particles. Basically, the selection is made so that the selected starting materials do not react with each other, for example, by selecting all the starting materials for the metal components of the shell material or all of the starting materials for the non-metal components of the shell material for the mixing in step d).

The non-selected (remaining) starting material and or non-selected (remaining) starting materials are added in step f) at several points of the tubular reactor.

If one has only two starting materials, as with binary II-VI, IV-VI or III-V compounds, one can mix either the metal component (II, IV or III), or the non-metal component (VI or V) in step d) with the dispersion of the core particles. The present studies indicate, however, that, depending on the nature of the particles, one can obtain more uniform core-shell particles, when mixing the metal component in step d) with the core particles and supplies the non-metal component in step f) at several points of the reaction zone of the tubular reactor, for example from outside via a membrane.

In ternary (e.g. CdZnS) or quaternary shell materials one will also ensure that the selection of starting materials in step c) is performed such that the reactive ingredients are kept separate to prevent premature reaction. Accordingly, here too, one will mix the metal components in step d) and supply the non-metal components in step f) (preferred), or vice versa.

In step d), the selected starting material or the selected starting materials for the shell material are mixed with the dispersion of the core particles. In order to obtain a homogeneous mixture as quickly as possible, one, therefore, provides the starting materials, insofar as they are present in dissolved form, preferably in the same solvent as present in the dispersion of the core particles. Preferably one also uses the same stabilizer or the same stabilizers, which, as mentioned above, can have the function of the solvent. Preferably, in step d), one mixes with the reaction product of the core particle synthesis, without isolating or otherwise treating the core particles after the synthesis.

In a particularly preferred embodiment of the process, which makes it possible to create a layer of a transition zone between the core and shell material, the reaction product of the core particle synthesis still comprises starting materials for the core material, which make up this transition zone. This will be explained in more detail below. Cooling of the reaction product of the core particle synthesis prior to the step d) is not required, but can be performed in one embodiment of the process.

The mixing of the starting material(s) for the shell material with the dispersion of the core particles in step d) is preferably carried out prior to entering the tubular reactor. However, it is also possible, although not preferred, to supply the dispersion of the core particles and the selected starting materials for the shell material to the tubular reactor separately in order to homogeneously mix them in the reactor, but before the reaction zone.

In step e), the mixture obtained in step d) is now passed continuously through a reaction zone of a tubular reactor.

In step f), one continuously supplies the non-selected (remaining) starting material(s) for the shell material, at two or more points, to the reaction zone of the tubular reactor.

This may be effected by providing a tubular reactor without membrane along the reaction zone with two or more conduits for the starting material(s) for the shell material and adding them accordingly.

By the adding in step f), one can achieve that at the beginning (and in the further course) of the reaction zone there is only a relatively low concentration of starting materials for the shell material available and that this preferably reacts by shell formation. The formation of new nuclei of shell material ("nucleation") is suppressed in this way.

In an alternative and preferred embodiment, one uses a tubular reactor having a tubular membrane as it is described above and below, and as it is also claimed. In this embodiment, one supplies the starting material(s) for the shell material through the membrane into the cavity of the membrane, which forms the reaction zone of the tubular reactor. Thus, in this case, the term "supply of shell starting material to the reaction zone at two or more points in the reaction zone" refers to the innumerable pores ("points") of the membrane through which the shell starting material enters into the reaction zone.

In step g), the starting materials for the shell material in the reaction zone react to form a shell around the particles of the core material. The reaction temperature in step g), i.e. in the reaction zone of the tubular reactor, is preferably more than 0 to 380° C., more preferably 25 to 260° C., even more preferably 80 to 200° C. In the synthesis of CdSe/ZnS or CdSe/CdZnS—NP one usually operates at 70 to 250° C., more preferably 90 to 130° C.

After emerging from the reaction zone, one can conduct the particles to mature in a growth chamber in order to promote the growth of a thicker shell. This growth chamber preferably has the same temperature as the reaction zone. In principle, one can influence the shell thickness through the concentration of the starting materials, the temperature in the reaction zone (which should be below the nucleation temperature for the shell precursors), the residence time and/or the amount of stabilizer.

Subsequent to step h), the core-shell nanoparticles can be isolated in a conventional manner, for example by centrifugation or by adding a solvent in which the particles show no or only a low dispersibility. Preferably, isolation is effected by centrifugation.

According to a preferred embodiment of the process, the dispersion of particles of the core material produced in step a) contains starting materials for the core material, for example, Cd and Se. Thus, advantageously one uses the prepared core particle dispersion containing unreacted starting materials for the core material, after synthesis without further purification and processing steps. In the reaction zone, the existing starting materials for the core material, cause the shell material not to grow directly on the cores to form a clear boundary between the core and shell material phase. Between the core and shell, there is formed a layer of a transition zone ("transition layer"), in which the proportion of the core material is gradually reduced in the direction of the shell, while the proportion of the shell material increases gradually. Thus, this transition layer is different from the transition layer of WO 2003/092043 in that it is made up of both core material and shell material with opposite gradients, and in that it does not contain ingredients other than the metal and non-metal components of the core and the shell material. The transition zone of CdSe/ZnS core-shell NP consists, for example, only of the elements Cd, Se, Zn and S.

This transition layer is formed, as long as there are still sufficient starting materials for the core material. The concentration of the starting materials for the core material decreases along the reaction zone in the flow direction of the cores, since no new starting materials for the core material are supplied. As soon as sufficient core starting materials for the growth of the transition layer are no longer available, only shell material is growing up.

Preferably, the average diameter of the core-shell nanoparticles is 1 to 100 nm, preferably from 3 to 15 nm, more preferably from 4 to 8 nm.

In case of deviation from the spherical shape, "diameter" means the maximum extent under microscopic analysis. A size determination is possible, for example, by TEM measurements, as described in the examples (by counting 100 particles, for example using the commercially available program "imageJ").

The particle size distribution of the nanoparticles is preferably such that the standard deviation (in nm) from the mean value of the diameter of the core-shell nanoparticles (in nm) is less than 20%, preferably less than 15%, more preferably less than 10%, even more preferably is less than 7.5% of the mean. Even values of less than 5% of the mean value can be achieved according to the invention, as the examples of this application show.

Particularly in the case of CdSe/ZnS or CdSe/CdZnS nanoparticles, the average diameter of the core is preferably from 2.6 to 4.6 nm, more preferably from 3.2 to 3.8 nm and/or the diameter of the shell is preferably from 0.2 to 2.5 nm.

Preferably, the average diameter of the transition layer is from 0.1 to 5 nm, preferably from 0.1 to 2 nm, preferably from 0.3 to 1.2 nm. The diameter can be determined via the concentration profile of the constituents of the core and shell material. Concentration profiles in nanoparticles can be detected by TEM measurements, as described by Z. Wang, Z. Li, A. Kornowski, X. Ma, A. Myalitsin, A. Mews, *small* 2011, 17, 2464-2468.

According to one embodiment of the process according to the invention, the core material and the shell material are each a II-VI or IV-VI semiconductor material, the starting material(s) for the II or IV component of the semiconductor material are selected in step c) and mixed with the dispersion of the particles of the core material in step d) and the starting material for the VI component of the semiconductor material, preferably a chalcogen such as S or Se, is supplied in step f). In principle, however, it is also possible to proceed conversely, and to mix the starting materials for the VI component with the dispersion of the particles of the core material and to supply the component II or IV in step f) to the reaction zone. This may affect the luminous characteristics in a positive manner.

According to a preferred embodiment of the process, the reaction zone of the tubular reactor is surrounded by a membrane. Thus, in step e), one passes the mixture obtained in step d) through a tubular membrane, which forms the reaction zone of the tubular reactor. Across the membrane the non-selected starting materials for the shell material are supplied in step f). This membrane is described in greater detail with reference to the figures and further description.

This membrane is fitted into a preferably heatable membrane module forming the tubular reactor together with the membrane.

Figure 4A:
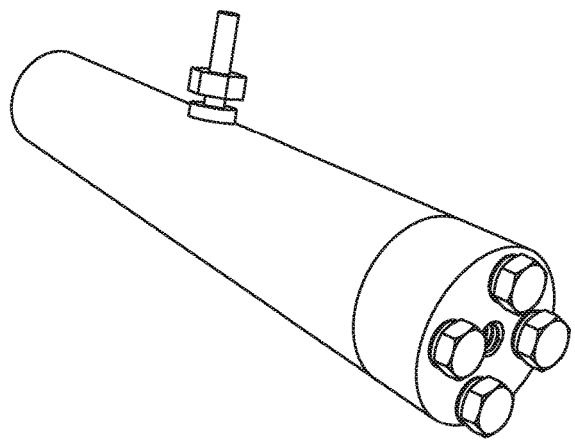
FIG. 4*a-c* show photographs of the closed tubular reactor (4*a*), the open tubular reactor with the membrane pulled out (4*b*), and a heating jacket developed for the tubular reactor.

FIG. 1 illustrates a possible configuration of this tubular reactor (membrane not shown here). The tubular reactor (1) comprises in the longitudinal direction at least one or a plurality of cylindrical cavities (2) for receiving one or more tubular membranes (7), which are not shown in FIG. 1. The tubular reactor (1) has, at the opposite ends, two removable closure elements (closure caps) (3a) and (3b). These closure elements can be fitted onto the body of the module provided to receive the membrane(s), and can be, for example, as shown in FIG. 4a, fixed liquid-tightly with four screws. Both closure elements (3a, 3b) have at least one continuous channel suitable for liquid transport (4a, 4b), which is in communication with a cylindrical cavity (2). The channel may be provided with a thread for attachment of inlet and outlet lines. One of the two channels (4a) is preferably used to pass the mixture of starting material(s) for the shell material and dispersion of the core particles obtained in step d) through the membrane (reaction zone) in the tubular reactor, while the other channel (4b) is then used to discharge the formed core-shell nanoparticles.

The flow velocity in the tubular reactor is chosen depending on the inner diameter of the membrane and with respect to an appropriate reaction time and can, for example, be from 0.5 to 10 ml/min. The residence time in the tubular reactor can be e.g. 1 min to 30 min and is the time from entry of the nano-core particles, e.g. cadmium selenide nano-core particles, into the interior of the membrane until exit of the core-shell nanoparticles from the tubular reactor.

In the wall of the cylindrical tubular reactor (1), there is provided at least one inlet (5) for the feeding of the starting material(s) for the shell material in step f) to the reaction zone in the membrane. This inlet (liquid channel), too, is preferably provided with a thread for receiving lines. Special restrictions on the position of the inlet (5) do not exist. Preferably, it is located within the first two thirds (in the flow direction) of the length of the reaction zone formed by the membrane. In an advantageous embodiment, which is shown in FIG. 4a, the inlet (5) is in the middle of the module (1) and hence also in the center of the reaction zone formed by the membrane. The liquid channel (6) is optional and can be used as an outlet for the starting material(s) of the shell material for another shell. The fluid channel (6) can thus also allow control of the lateral flow in addition to the pump pressure.

For temperature control one can provide a temperature sensor (8) shown in FIG. 1 (and FIG. 3) in the wall of the cylindrical reactor (1).

In step f) the feeding of the starting material(s) for the shell material through the pores of the membrane and thus a large number of points to the reaction zone inside the membrane occurs.

Tubular reactors of the type described above can be produced through development and modification of commercially available membrane modules for wastewater treatment. As a starting point for the construction of a tubular reactors suitable for the present invention, for example, the membrane modules offered by atech innovations GmbH, 45966 Gladbeck, Germany, can be used, which are used for wastewater treatment.

These commercially available modules produced from steel are not suitable for the synthesis of nanoparticles, so that it is preferable in the invention to produce the tubular reactor from a metallic material that is chemically inert even at higher temperatures, such as titanium. Furthermore, as already explained, the second liquid channel (6) present in the atech-modules in the reactor wall is often not necessary. By suitable addition via a single inlet (5), one can achieve that the starting material or the starting materials for the shell material are be completely absorbed by the reaction zone through the membrane wall, so that no outlet is required. Moreover, in contrast to waste water treatment, it is usually necessary to design the module as heatable, as will be explained in connection with FIG. 4c below.

Figure 2:
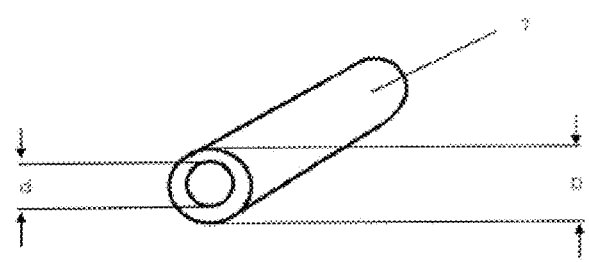
FIG. 2 shows the tubular membrane, which is fitted into the channel of the tubular reactor.

FIG. 2 shows a suitable membrane according to the invention (7) having an outer diameter D and an inner diameter d. The inner diameter of the membrane(s) used is preferably 0.2-5 cm, more preferably 0.4 to 1 cm. When supplying the starting material(s) for the shell material in step f), these wash around the membrane. The starting material(s) penetrate through the pores to the reaction zone inside the membrane where they first come into contact with the starting material or the starting materials for the shell material, which were mixed with the dispersion of the core particles in step d). The starting materials react with one another to form a shell on the core particles, if appropriate after formation of the preferred transition layer.

The tubular membrane (7) is preferably made of a ceramic material such as $Al_2O_3$ or $TiO_2$. The pore size of the membrane is selected depending on the size of the core particles used. In the generally preferred synthesis of core-shell nanoparticles with an overall mean diameter of less than 20 nm, especially up to 15 nm, one can advantageously work with membranes whose pore diameter corresponds to a MWCO (molecular weight cut off) for a hypothetical globular protein (with 90% retention), of e.g. 200 Daltons or less, e.g. 100 Daltons or less, e.g. 80 Daltons or less, e.g. 50 daltons or less, or 20 daltons or less. Apart from the pore diameter of the membrane, one can ensure also via the pump pressure at the inlet (5), that the passage of core particles is minimized or prevented by the membrane.

Figure 3:
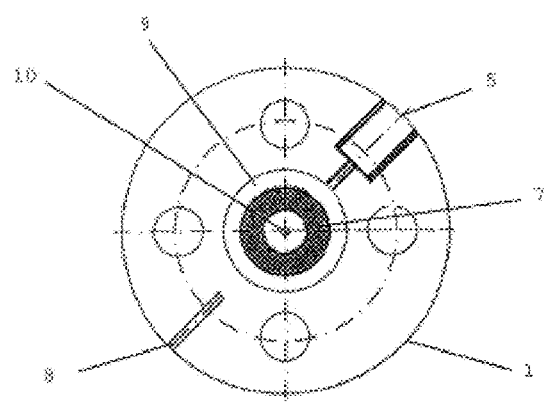
FIG. 3 shows a cross section through the tubular reactor having a membrane.

FIG. 3 shows a cross section through the tubular reactor (1) having a therein-fitted membrane (7) on the height of the inlet (5). The membrane is disposed longitudinally (along the flow direction) in the cavity (2) of the tubular reactor (1). The membrane divides the cavity (2) (see FIG. 1) into an addition zone (9) and a reaction zone (10).

It can be seen that the diameter of the cylindrical cavity (2) should be greater than the outer diameter of the membrane, so that, in the addition zone (9), it can be washed around by starting material(s) for the shell material, that are supplied via the inlet (5).

Figure 4B:
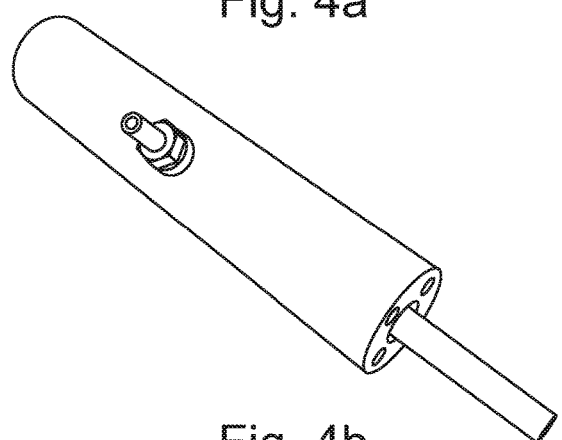
Figure 4C:
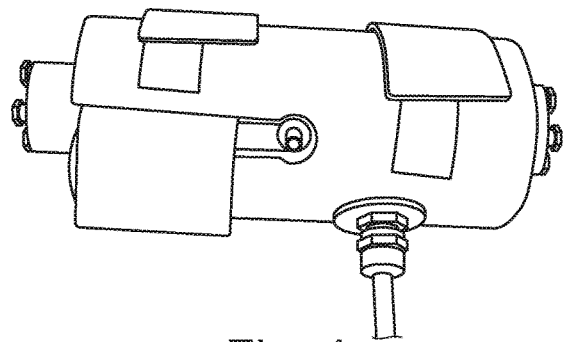

FIG. 4a shows an advantageous embodiment of the tubular reactor with only one inlet (5). FIG. 4b shows the tubular reactor (1) after removal of one of the removable closure elements (3a, 3b) with pulled-out membrane (7). FIG. 4c shows a heating sleeve developed for the tubular reactor (1), which surrounds the metal jacket as precisely as possible. According to the invention it is however also possible to heat the reaction zone of the tubular reactor in some other way, for example, by immersion in a heating bath or by the installation of heating elements in the tubular reactor.

An aspect of the invention is also the already explained preferred embodiment of the core-shell nanoparticles, which is characterized by a transition layer between the core and shell which compensates for lattice strain between the core and shell material and thus also contributes to increased quantum yields.

This embodiment relates to core-shell nanoparticles comprising a core of a core material, preferably a first semiconductor material, and an outer shell made of a shell material, preferably of a second semiconductor material, characterized in that, between the core and shell, there is only a layer of a transition zone, in which the proportion of the core material is gradually reduced in the direction of the shell, while the proportion of the shell material increases gradually.

It is preferred that, in the inventive core-shell nanoparticles, the core is of a light-emitting semiconductor material and the particle size distribution of the nanoparticles is such that the particles, upon irradiation, emit light at a spectral half-value width (full width at half maximum, FWHM) of less than 40 nm, e.g. not more than 35 nm, preferably not more than 30 nm.

The particle size distribution of the nanoparticles is preferably such that the standard deviation (in nm) from the mean value of the diameter of the core-shell nanoparticles (in nm) is less than 20%, preferably less than 15%, more preferably less than 10%, even more preferably less than 6.5% of the mean.

The above description of the core-shell nanoparticles produced in the inventive process is fully applicable to the claimed embodiment with transition zone.

Thus, for example, it is also the case that the average diameter of the transition zone is 0.1 to 5 nm, preferably from 0.3 to 1.2 nm, and preferably the average diameter of the core-shell nanoparticles is 1 to 100 nm, preferably from 3 to 15 nm, more preferably 4 to 8 nm.

Preferably, the core material and the shell material are each a semiconductor material, preferably each are a II-VI, III-V or IV-VI semiconductor material.

Particularly preferred are core-shell nanoparticles, wherein the core-shell nanoparticles have a combination of the following core-shell materials: CdSe/ZnS, CdSe/CdZnS, CdSe/CdZnSe.

In a further embodiment, core-shell nanoparticles are claimed, wherein the core-shell nanoparticles are obtainable by a process as defined above and in the claims.

The embodiment of the tubular reactor described previously and in the claims makes it possible to implement the process according to the invention in a particularly simple, but effective and therefore cost-effective manner.

The membrane of the tubular reactor is preferably made of a ceramic material such as $Al_2O_3$ or $TiO_2$, and the pore size is selected such that it prevents passage of the core particles into the surrounding addition zone.

Due to the reaction occurring over the entire length of the tubular reactor, it has been found to be advantageous that, in the inventive tubular reactor, there is provided exactly one connection (5) in the wall for the addition of further starting material for the shell, which may be located, for example, centrally in the longitudinal direction of the reactor, but also at a different position in the first two thirds (in the longitudinal and flow direction) of the reactor. This allows the added shell starting material to fully contribute to the shell-forming reaction, which avoids repeated recycling or disposing of unused material, allowing a shorter synthesis time. Since no discharge for unused shell starting material must be provided, the design of the reactor can be simplified, thus reducing its procurement costs. The one connection allows a uniform distribution of the shell starting material to be added in the addition zone and thus an increasing concentration of the shell starting material in the reaction zone (where it is entrained in the flow direction of the reacting mixture and thus accumulates in direction of flow).

In an alternative embodiment of the tubular reactor of the invention, an additional connection is provided in the wall, either for the supply of further starting material for shell formation or for discharging of the starting material for shell formation. In this way, the concentration of the shell starting material along the addition zone and, for example, the increase of the concentration of the shell starting material along the reaction zone can be controlled or the lateral flow can be controlled more accurately. Should it be desired, the further connection can also be used for the discharge of excess starting material for the shell.

Particularly preferably, the wall of the tubular reactor, as well as possibly other components, such as the closure elements, are made of titanium. By this choice of material, an inert reaction environment can be provided which is not corroded even at the high temperatures necessary for the formation of the nanoparticles of the invention and in the presence of chemically aggressive starting materials.

It is particularly advantageous that, according to another embodiment of the tubular reactor, the membrane is tubular and the inside forms the reaction zone. In this way, there is provided a particularly large surface for the influx of shell starting material (or other substances to be added) extending along the cavity from the addition zone through the membrane into the reaction zone, with correspondingly multifold increased reaction efficiency.

According to a further preferred embodiment, the reactor is fluid-tightly closed on both ends by a removable closure element, in which the inlet and discharge are embedded. In this embodiment, the closure elements are connected to the open ends of the tubular cavity comprising the membrane. Thus, a modular tubular reactor can be provided, whose removable closure elements, which are provided at the ends, allow access to the interior of the reactor, for example for the introduction of the membrane. Also, depending on the nature of the performed synthesis reaction, closure elements having a plurality of inlet or discharge lines can be provided, or more reactors can be connected.

Finally, it is particularly advantageous that the tubular reactor comprises a preferably sleeve-shaped heating device for heating the reaction zone. By heating the reaction zone, the synthesis reaction can proceed much faster. Furthermore, by choosing a suitable temperature, the reaction result, i.e. the quality or structure of the produced core-shell nanoparticles, can also be influenced.

EXAMPLES

Measurement Methods
Mean Diameter (TEM)

The mean diameter was determined by measurement of 100 particles in the TEM image. The program imageJ 1.40 g Wayne Rasband, National Institutes of Health, USA, Java 1.6.0_05, 1720 K of 594 MB (<1%) was used. After calibration of pixel sizes using the length scale in the TEM image, the areas of the particles could be determined by manual delineation of an enveloping circle. From the area of each particle, the diameters could be calculated.

Quantum Yield

The quantum yield was determined by reference measurement against Rhodamine 6G. For this purpose, the absorption of the sample to be determined with the absorption of the dispersed dye is measured. Then one emission measurement per case is conducted. As the excitation wavelength, the wavelength is used at which both samples have an identical optical density. The quantum yield is obtained from the ratio of the two areas under the emission curve multiplied by the quantum yield of the reference dye (here 0.96).

FWHM

The FWHM value (full width at half maximum) is determined by the emission band. This is the full signal width at half peak height. The smaller this value, the narrower the size distribution.

Reference Example 1—CdSe Core Nanoparticle

Preparation of the Cadmium Stock Solution

The synthesis is described with reference to FIGS. 1a, 1b and 1c of WO 2009/101091.

1.15 g of cadmium acetate was added to 45 ml of squalene, 3.5 ml of oleic acid and 20 ml of oleylamine at room temperature. The mixture was degassed under reduced pressure, purged with nitrogen and heated to 150° C. It was a cloudy yellow solution. This was degassed for 2 h at 100° C. under reduced pressure. The now pale yellow clear solution was stored under nitrogen atmosphere at room temperature.

Preparation of the selenium stock solution. In a glove box, 2.0 g of selenium was dissolved in 17 mL of trioctylphosphine at room temperature. To this solution was added 53 mL squalene. This solution was stored under inert conditions at room temperature.

Preparation of the CdSe core nanoparticles. The cadmium solution and the selenium solution were connected via 2 pumps and passed into the module 15 (see FIG. 1 of WO 2009/101091). The nucleation chamber 60PSM (see FIG. 1b of WO 2009/101091) was heated to the nucleation temperature (ca. 250° C.). The growth furnace 65PSM was set to the growth temperature (about 240° C.) and the two preheating furnaces 55PSMa and 55PSMb were set to the nucleation temperature (ca. 250° C.). The flow rates were chosen in relation to an appropriate reaction time in apparatus 20. Residence time is defined as the time required for flow through of the nucleation chamber 60PSM and the growth furnace 65PSM. The optical properties of the nanoparticles produced were measured after reaching twice the residence time. The adjustable synthesis parameters are, on the one hand, the flow rate and, on the other hand, the temperature. The best synthesis parameters for the production of CdSe core nanoparticles were determined from previous experiments.

The average particle diameter of the cores thus produced was determined by TEM measurements to be about 3.4 nm. The quantum yield was about 40%.

Example 1—CdSe/CdZnS—Core-Shell Nanoparticles

Preparation of the zinc stock solution. 466 mg of zinc acetate were dissolved in 12 mL of squalene and 4.0 mL trioctylphosphine at 200° C. The solution was clear and colorless. This solution was stored under inert conditions at room temperature and can be used as alloy precursor (starting material for shell).

Preparation of cadmium stock solution. 533 mg of cadmium acetate were dissolved in 11 mL of squalene, 1.6 mL of oleic acid and 4.0 mL of oleylamine at 130° C. The pale yellow clear solution was then degassed for 4 h at 110° C. under reduced pressure. This solution was stored under inert conditions at room temperature and can be used as alloy precursor.

Preparation of the sulfur stock solution. In a glove box, 0.8 mL of bis (trimethylsilyl) sulfide were mixed with 11 mL trioctylphosphine at room temperature. The solution was clear and slightly yellowish. This solution was stored under inert conditions at room temperature and can be used as alloy precursor.

The CdSe nanoparticles were prepared as in Reference Example 1 described above. The dispersion thus produced (about 1 wt. %) still contained amounts (approximately 0.2 mol/l) of the starting material for the selenium component and small amounts of starting material for the cadmium component of the CdSe cores.

Mk2 (° C.) indicates the temperature of the mixing chamber and VO (° C.) the temperature of the growth furnace, which is connected downstream of the tubular reactor with the membrane.

TABLE 1

CdSe/Cd$_x$Zn$_{(1-x)}$S core-shell nanoparticles

| Sample | v(Zn + Cd) [mL/min] | v(S) [mL/min] | Heating jacket [° C.] | Mk2 [° C.] | VO [° C.] | Emission | FWHM | QY (Stock) |
|---|---|---|---|---|---|---|---|---|
| M7_B_90  | 0.4 | 0.6 | 90  | 90  | 120 | 591 | 28 | 75 |
| M7_B_100 | 0.4 | 0.6 | 100 | 100 | 120 | 593 | 29 | 75 |
| M7_B_110 | 0.4 | 0.6 | 110 | 110 | 120 | 590 | 30 | 80 |
| M7_B_120 | 0.4 | 0.6 | 120 | 120 | 120 | 590 | 32 | 75 |

Preparation of the CdSe/CdZnS core-shell nanoparticles. A tubular reactor made of titanium, such as is illustrated in FIGS. 1 to 4, but with only one inlet (FIG. 4a), was provided with an Al$_2$O$_3$ membrane (type 1/6, length 20 cm or 50, 20 k, or 100 k daltons), which can be purchased from atech innovations GmbH, 45966 Gladbeck, Germany. The membrane had a channel with an inner diameter of 6 mm and an outer diameter of 10 mm. The inner diameter of the tubular reactor (module) was 11.2 mm. The tubular reactor was heated via a heating jacket, as shown in FIG. 4c, to a temperature of about 110° C. The tubular reactor serves as a growth furnace for the alloy shell and replaces in FIG. 1c of WO 2009/101091 the upper heating chamber 55SSM. The CdSe core nanoparticles were mixed prior to entry into the interior of the membrane with the zinc and the cadmium precursor at room temperature in a mixing chamber, which replaces the nucleation chamber 60SSM in FIG. 1c, and supplied to the mixing chamber ("Mk2") by pumps via lines 35h and 35ca. Using a solvent organizer, a pump ratio of Zn/Cd of 40% to 60% was set.

The sulfur precursor was fed by a further pump via the inlet of the tubular reactor (see FIG. 4a) to the outside of the membrane and diffused through the membrane into the interior of the tubular reactor in which the shell growth takes place. Due to the separate addition of the starting materials (precursors) the unintentional formation of CdS or ZnS core nanoparticles is prevented. Addition via an elongated tubular membrane creates a concentration gradient which favors epitaxial growth of the alloy shell.

To extend the growth time, CdSe—CdZnS core-shell nanoparticles were passed into a further growth furnace after exiting the module. This was heated to the same temperature as the membrane furnace 65PSM. The residence time in the tubular reactor is the time from entry of cadmium selenide nano-core particles into the interior of the membrane until the exit of the core-shell nanoparticles from this growth furnace it is about 8 minutes when using the 20 cm long membrane and about 16 minutes when using the 50 cm long membrane.

The optical properties of the nanoparticles produced were measured after reaching twice the residence time. The adjustable synthesis parameters are, on the one hand, the flow rates and, on the other hand, the temperature. The best synthesis parameters for the production of CdSe core CdZnS alloy nanoparticles were determined from previous experiments, and are summarized in Table 1 below.

After the synthesis of the CdSe/CdZnS core-shell nanoparticles, the module was rinsed with pure solvent and allowed to cool to room temperature.

The average particle diameter of the thus prepared core-shell NPs was determined by TEM measurements to be from 4.3 to 4.6 nm with the standard deviations given in the following Table 2. The quantum yield was 60-70%.

TABLE 2

CdSe/Cd$_x$Zn$_{(1-x)}$S core-shell nanoparticles

| Reaction temperature of the shell | Diameter of the core-shell NP | Standard deviation | Number of monolayers |
|---|---|---|---|
| 90  | 4.6 | 0.23 | 1.9 |
| 100 | 4.6 | 0.25 | 1.9 |
| 110 | 4.3 | 0.27 | 1.3 |
| 120 | 4.5 | 0.28 | 1.7 |

Repeating the particle synthesis of Example 1, one notes only very small variations in product quality. Thus, for example, the deviation of the emission maximum is generally much less than 1%.

Example 2—CdSe/ZnS—Core-Shell Nanoparticles

The CdSe nanoparticles were prepared as in Reference Example 1 described above. The dispersion produced (about 1 wt. %) still contained amounts (approximately 0.2 mol/l) of the starting material for the selenium component and small quantities of the starting material for the cadmium component of the CdSe cores.

The preparation of the zinc stock solution and the sulfur stock solution was carried out as in Example. 1

The preparation of the CdSe/ZnS core-shell nanoparticles was carried out using the tubular reactor and experimental setup described in Example 1 in different series of experiments:

"Atech8 series A" and "series B" differed in the addition of the shell starting materials (precursor).
  In series A, the CdSe cores are mixed beforehand with the sulfur precursor solution in a mixing chamber ("Mk2") before being fed into the interior of the tubular reactor. The zinc precursor solution is fed via the inlet (5) to the outside of the membrane, and passes through the membrane into the interior of the tubular membrane, in which the shell growth takes place.
  In series B, the two precursor solutions are supplied the other way around in comparison to series A.

The test series "M8_B" and "M8_C" differed in the zinc/sulfur ratio, which was set via the flow rates of the precursor solutions (v(Zn) and v(S), respectively):

In the test series M8_B, the molar ratio between zinc and sulfur is 1:2.6,
in the test series M8_C, by contrast, 1:4.5.

The following Tables 3 and 4 summarize the results of the test series. Mk2 (° C.) indicates the temperature of the mixing chamber and VO (° C.) the temperature of the downstream growth chamber. The resulting CdSe/ZnSe core-shell nanoparticles were evaluated for their quantum yield (QY) and particle size distribution. Since the emission wavelength depends on the particle diameter of semiconductor NPs, the FWHM (full width at half maximum) is a measure of the breadth of the particle size distribution. The smaller the value, the narrower the particle size distribution.

The supply of the S-precursor across the membrane from the outside resulted in particles with a more uniform spherical shape (series B). The reverse feeding of Zn and S precursor (series A), however, gives higher quantum yields.

For comparison, the emission wavelength (580 nm) of the CdSe cores prepared in Reference Example 1 and their FWHM value (about 28 nm) were determined. The quantum yield of the CdSe cores was approximately 40%.

The comparison with the FWHM values for the CdSe cores shows that the growth of the ZnS shell material leads only to a slight broadening of the particle size distribution. At the same time, for the reaction temperatures preferred in this system of at least 90° C., more preferably at least 100° C., one obtains a significant improvement of the quantum yield.

Repeating the particle synthesis of Example 2, one notes only very small variations in product quality. Thus, for example, the deviation of the emission maximum is generally markedly less than 1%.

TABLE 3

Atech 8 Series A CdSe/ZnS core-shell nanoparticles

| Sample | v(Zn) [mL/min] | v(S) [mL/min] | Heating jacket [° C.] | Mk2 [° C.] | VO [° C.] | Emission | FWHM | QY (Stock) |
|---|---|---|---|---|---|---|---|---|
| M8_B_80_SeriesA | 0.3 | 0.55 | 80 | 80 | 80 | 584 | 32 | 42 |
| M8_B_90_SeriesA | 0.3 | 0.55 | 90 | 90 | 90 | 583 | 30 | 56 |
| M8_B_100_SeriesA | 0.3 | 0.55 | 100 | 100 | 100 | 585 | 30 | 58 |
| M8_B_110_SeriesA | 0.3 | 0.55 | 110 | 110 | 110 | 585 | 29 | 60 |
| M8_B_120_SeriesA | 0.3 | 0.55 | 120 | 120 | 120 | 584 | 30 | 61 |
| M8_C_80_SeriesA | 0.25 | 0.8 | 80 | 80 | 80 | 585 | 31 | 40 |
| M8_C_90_SeriesA | 0.25 | 0.8 | 90 | 90 | 90 | 583 | 31 | 55 |
| M8_C_100_SeriesA | 0.25 | 0.8 | 100 | 100 | 100 | 583 | 30 | 47 |
| M8_C_110_SeriesA | 0.25 | 0.8 | 110 | 110 | 110 | 586 | 30 | 50 |
| M8_C_120_SeriesA | 0.25 | 0.8 | 120 | 120 | 120 | 585 | 30 | 63 |

TABLE 4

Atech 8 Series B CdSe/ZnS core-shell nanoparticles

| Sample | v(Zn) [mL/min] | v(S) [mL/min] | Heating jacket [° C.] | Mk2 [° C.] | VO [° C.] | Emission | FWHM | QY (Stock) |
|---|---|---|---|---|---|---|---|---|
| M8_B_80_SeriesB | 0.3 | 0.55 | 80 | 80 | 80 | 579 | 29 | 38 |
| M8_B_90_SeriesB | 0.3 | 0.55 | 90 | 90 | 90 | 582 | 29 | 52 |
| M8_B_100_SeriesB | 0.3 | 0.55 | 100 | 100 | 100 | 583 | 29 | 56 |
| M8_B_110_SeriesB | 0.3 | 0.55 | 110 | 110 | 110 | 585 | 31 | 44 |
| M8_B_120_SeriesB | 0.3 | 0.55 | 120 | 120 | 120 | 586 | 32 | 48 |
| M8_C_80_SeriesB | 0.25 | 0.8 | 80 | 80 | 80 | 585 | 31 | 43 |
| M8_C_90_SeriesB | 0.25 | 0.8 | 90 | 90 | 90 | 584 | 30 | 37 |
| M8_C_100_SeriesB | 0.25 | 0.8 | 100 | 100 | 100 | 582 | 30 | 50 |
| M8_C_110_SeriesB | 0.25 | 0.8 | 110 | 110 | 110 | 584 | 30 | 40 |
| M8_C_120_SeriesB | 0.25 | 0.8 | 120 | 120 | 120 | 585 | 32 | 43 |

Diameter with Standard Deviation:

For the determination of the diameter of the CdSe/ZnS core-shell NP obtained according to Table 3 and 4, 100 nanoparticles (TEM images) were counted using the imageJ program and from these data the standard deviation from the mean was calculated. The results are summarized in the two following Tables 5 and 6.

The results in Table 5 relate to CdSe/ZnS core-shell NP whose shell were synthesized with the settings listed in Table 3 (Atech 8 series A) of M8_B_90_SeriesA to M8_B_120_SeriesA.

The results in Table 6 relate to CdSe/ZnS core-shell NP whose shell were synthesized with the settings listed in Table 4 (Atech 8 series B) of M8_B_90_SeriesB to M8_B_120_SeriesB.

TABLE 5

| CdSe/ZnS core-shell NP | | | |
|---|---|---|---|
| Reaction temperature of the shell | Diameter of the core-shell NP | Standard deviation | Number of monolayers |
| 90 | 3.8 | 0.19 | 0.5 |
| 100 | 4.0 | 0.16 | 0.7 |
| 110 | 4.0 | 0.20 | 0.8 |
| 120 | 3.8 | 0.27 | 0.7 |

TABLE 6

| CdSe/ZnS core-shell NP | | | |
|---|---|---|---|
| Reaction temperature of the shell | Diameter of the core-shell NP | Standard deviation | Number of monolayers |
| 90 | 3.9 | 0.19 | 0.5 |
| 100 | 4.0 | 0.21 | 0.7 |
| 110 | 3.9 | 0.21 | 0.8 |
| 120 | 4.0 | 0.23 | 0.7 |

It can be seen that the standard deviation (in nm) from the mean value of the diameter of the core-shell nanoparticles (in nm) is not more than about 7% of the average, which corresponds to a very narrow particle size distribution.

Comparative Example

CdSe/ZnS core-shell nanoparticles were not produced according to the invention using a tubular reactor, but according to the teaching of WO 2009/101091 using a continuous flow reactor, analogous to Example 4 of this application at a temperature of the nucleation chamber 60 SSM and growth chamber 65 SSM of 90° C. The emission wavelength of the resulting CdSe/ZnS core-shell nanoparticles was 583 nm, the FWHM was 33 nm, and the quantum yield was about 34%.

The invention claimed is:

1. A process for the continuous preparation of core-shell nanoparticles comprising a core of a core material and a shell of a shell material,
the process comprising the steps of:
a) preparing a dispersion of nanoparticles of the core material in a solvent,
b) providing all starting materials for the shell material,
c) the selection of one or more starting materials for the shell material for the step d), the selection being made so that the selected starting materials do not react with each other,
d) mixing the selected starting material or the selected starting materials for the shell material with the dispersion of the nanoparticles from the core material,
e) continuously passing the mixture obtained in step d) through a reaction zone of a tubular reactor,
f) continuously feeding the starting material not selected in step c) or the starting materials not selected in step c) for the shell material at two or more locations to the reaction zone,
g) reacting the starting materials for the shell material in the reaction zone to form a shell around the nanoparticles from the core material.

2. The process according to claim 1, wherein the core-shell nanoparticles have a transition zone between the core and shell consisting only of the components of the core and the components of the shell material, and in which in the direction of the shell, the proportion of the core material gradually decreases and at the same time the proportion of the shell material gradually increases, and wherein the dispersion of particles of the core material produced in step a) contains at least one starting material for the core material, wherein in the reaction zone, the existing starting materials for the core material, cause the shell material not to grow directly on the cores to form a clear boundary between the core and shell material phase.

3. The process according to claim 1, wherein the average diameter of the core-shell nanoparticles is from 1 to 100 nm.

4. The process according to claim 2, wherein the average diameter of the transition zone is 0.1 to 5 nm.

5. The process according to claim 1, wherein the core material and the shell material are selected from the group of II-VI, IV-VI and III-V semiconductor materials.

6. The process according to claim 1, wherein the core material and the shell material both are each a II-VI, IV-VI or III-V semiconductor material, composed of metal and non-metal components, and one or more starting materials for the metal component(s) of the shell or one or more starting materials for the non-metal component(s) of the shell are selected in step c) and mixed in step d) with the dispersion of the particles of the core material and in step f) the non-selected one or more starting materials for the non-metal component(s) or metal component(s) for the shell material are fed continuously at two or more locations to the reaction zone.

7. The process according to claim 1, wherein the reaction zone of the tubular reactor is surrounded by a membrane, via which the one or more starting materials for the shell material not selected in step c) are supplied in step f).

8. The process according to claim 1, wherein all the starting materials for the shell material are present in solution and at least one solution of a starting material contains a stabilizer, which can bind to the surface of the formed core-shell particles via a functional group.

9. The process according to claim 1, wherein the temperature in the reaction zone of the tubular reactor is more than 0 to 380° C.

* * * * *